(12) United States Patent
Kamimura et al.

(10) Patent No.: US 8,921,135 B2
(45) Date of Patent: Dec. 30, 2014

(54) METHOD FOR MANUFACTURING DEVICE

(71) Applicants: Ulvac, Inc., Kanagawa (JP); Marubun Corporation, Tokyo (JP); Toshiba Kikai Kabushiki Kaisha, Tokyo (JP)

(72) Inventors: Ryuichiro Kamimura, Susono (JP); Yamato Osada, Susono (JP); Yukio Kashima, Tokyo (JP); Hiromi Nishihara, Numazu (JP); Takaharu Tashiro, Numazu (JP); Takafumi Ookawa, Numazu (JP)

(73) Assignees: Ulvac, Inc., Kanagawa (JP); Marubun Corporation, Tokyo (JP); Toshiba Kikai Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/115,073

(22) PCT Filed: Feb. 18, 2013

(86) PCT No.: PCT/JP2013/053813
§ 371 (c)(1),
(2), (4) Date: Oct. 31, 2013

(87) PCT Pub. No.: WO2013/132993
PCT Pub. Date: Sep. 12, 2013

(65) Prior Publication Data
US 2014/0057377 A1 Feb. 27, 2014

(30) Foreign Application Priority Data
Mar. 7, 2012 (JP) .................................. 2012-050199

(51) Int. Cl.
*H01L 21/00* (2006.01)
*H01L 33/22* (2010.01)
*H01L 21/3213* (2006.01)
*H01L 33/00* (2010.01)
*H01L 33/20* (2010.01)
*H01L 33/10* (2010.01)

(52) U.S. Cl.
CPC .......... *H01L 33/22* (2013.01); *H01L 21/32139* (2013.01); *H01L 33/007* (2013.01); *H01L 2933/0083* (2013.01); *H01L 33/20* (2013.01); *H01L 33/10* (2013.01)
USPC .............................................. 438/29; 438/717

(58) Field of Classification Search
CPC ............... G03F 1/60; G03F 1/44; G03F 1/32; H01L 21/32139; H01L 33/22; H01L 33/10; H01L 33/20; H01L 33/007
USPC ...................................................... 438/29, 717
See application file for complete search history.

(56) References Cited

U.S. PATENT DOCUMENTS 7,736,954 B2 * 6/2010 Hussain et al. ............... 438/149
7,891,636 B2 * 2/2011 Zhang et al. .................. 249/134

(Continued)

FOREIGN PATENT DOCUMENTS

CN 1800984 A 7/2006
CN 102157642 A 8/2011

(Continued)

*Primary Examiner* — William D Coleman
(74) *Attorney, Agent, or Firm* — Christensen Fonder PA

(57) ABSTRACT

A method for manufacturing a device having a concavo-convex structure includes forming an organic resist film on an n-type semiconductor layer in which a fine concavo-convex structure is to be formed; forming a silicon-containing resist film on the organic resist film; patterning the silicon-containing resist film by nanoimprint; oxidizing the silicon-containing resist film with oxygen-containing plasma to form a silicon oxide film; dry-etching the organic resist film by using the silicon oxide film as an etching mask; dry-etching the n-type semiconductor layer by using the silicon oxide film and the organic resist film as an etching masks; and removing the silicon oxide film and the organic resist film.

5 Claims, 5 Drawing Sheets

(56) References Cited

U.S. PATENT DOCUMENTS

| | | | |
|---|---|---|---|
| 7,960,090 B2* | 6/2011 | Terasaki et al. | 430/270.1 |
| 8,282,381 B1 | 10/2012 | Zhu et al. | |
| 8,435,819 B2* | 5/2013 | Wei et al. | 438/42 |
| 8,679,392 B2* | 3/2014 | Yanagisawa | 264/293 |
| 2002/0064496 A1* | 5/2002 | Nishibayashi et al. | 423/446 |
| 2007/0082279 A1* | 4/2007 | Mizutani et al. | 430/30 |
| 2007/0264591 A1 | 11/2007 | Wuister et al. | |
| 2010/0308008 A1 | 12/2010 | Zhu et al. | |
| 2010/0308009 A1 | 12/2010 | Zhu et al. | |
| 2010/0308512 A1 | 12/2010 | Zhu et al. | |
| 2012/0232182 A1 | 9/2012 | Zhu et al. | |
| 2013/0022930 A1* | 1/2013 | Clevenger et al. | 430/326 |
| 2013/0084352 A1 | 4/2013 | Suzuki et al. | |

FOREIGN PATENT DOCUMENTS

| | | |
|---|---|---|
| JP | 2010-284970 A | 12/2010 |
| JP | 2011-035078 A | 2/2011 |
| JP | 2011-138586 A | 7/2011 |
| JP | 2011-211083 A | 10/2011 |
| WO | WO 2011/122605 A1 | 10/2011 |

* cited by examiner

METHOD FOR MANUFACTURING DEVICE

RELATED APPLICATIONS

The present is a National Phase entry of PCT Application No. PCT/JP2013/053813, filed Feb. 18, 2013, which claims priority from Japanese Patent Application No. 2012-050199, filed Mar. 7, 2012, the disclosures of which are hereby incorporated by reference herein in their entirety.

TECHNICAL FIELD

The present invention relates to a method for manufacturing a device having a fine concavo-convex structure.

BACKGROUND ART

There is a method for forming a so-called photonic crystal, which is a nano-order fine concavo-convex structure, in a light emitting device such as a light emitting diode or a laser diode in order to enhance the light extraction efficiency of the device (for example, see Patent Document 1). This method includes the steps of laminating an etching mask made of silicon oxide on a first nitride semiconductor layer and forming pores in the first nitride semiconductor layer via the etching mask by photolithography, thereby forming a fine concavo-convex structure in the first nitride semiconductor layer.

PRIOR ART DOCUMENT

Patent Document 1: Japanese Laid-Open Patent Publication No. 2011-35078

SUMMARY OF THE INVENTION

In a photonic crystalline structure, for example, when the internal diameter of a concave portion becomes small, the wavelength band which enhances the light extraction efficiency may be made small. However, when forming the photonic crystalline structure by lithography, the resolution is limited due to exposure wavelength. Therefore, it was difficult to optimize the internal diameter of a concave portion and the diameter of a convex portion and increase the aspect ratio for the purpose of improving the light extraction efficiency. As a result, it was difficult to form the concavo-convex structure by lithography.

In view of this, a method using nanoimprint has also been proposed. In the method using the nanoimprint, a master mold is used to transfer a fine concavo-convex structure to a resist film, and dry etching is conducted using the resist film. In this method, a fine concavo-convex structure having a size of, for example, several tens of nanometers or less may also be formed. Further, since the fine concavo-convex structure is formed by a simple process of pressing the master mold against the resist film, the effect of reducing manufacturing costs may also be obtained as compared to when it is formed by photolithography.

In the nanoimprint process, it is important to ensure the mold release of the master mold from a resist film to which the concavo-convex structure is transferred. However, the increase in depth of the concave portion in the master mold for obtaining a fine concavo-convex structure having a high aspect ratio causes attachment of the resist film to the master mold and defective shapes of the concave portion and the convex portion after release of the master mold. Therefore, the depth of the concave portion and the height of the convex portion in the master mold are subject to restrictions. Thus, it was difficult to form a fine concavo-convex structure having a high aspect ratio using only the nanoimprint process.

Accordingly, it is an object of the present invention to provide a method for manufacturing a device including a fine concavo-convex structure having a high aspect ratio.

A first aspect is a method for manufacturing a device having a concavo-convex structure, the method including the steps of: forming an organic resist film on a concavo-convex structure formation layer in which a concavo-convex structure is to be formed; forming a silicon-containing resist film on the organic resist film; patterning the silicon-containing resist film by nanoimprint; oxidizing the silicon-containing resist film with oxygen-containing plasma to form a silicon oxide film; dry-etching the organic resist film by using the silicon oxide film as an etching mask; dry-etching the concavo-convex structure formation layer by using the silicon oxide film and the organic resist film as an etching masks; and removing the silicon oxide film and the organic resist film.

According to the first aspect, a concavo-convex structure is formed by laminating a silicon-containing resist film on an organic resist film, patterning the silicon-containing resist film by nanoimprint, and forming a bilayer resist by dry-etching the organic resist film. When a monolayer resist is formed using the nanoimprint process, the film thickness is restricted for the purpose of ensuring the mold release. However, by forming a bilayer resist using dry etching, the film thickness of the resist may be able to be increased. Therefore, by using the bilayer resist, concave portions having a high aspect ratio may be formed in the concavo-convex structure formation layer. Further, the resist film made of silicon oxide is formed as the upper layer of the bilayer resist. Thus, the selectivity of the concavo-convex structure formation layer to the resist film may be improved.

In a second aspect, the method for manufacturing a device according to the first aspect further including the step of removing the remaining layer that remains in the concave portion formed by the nanoimprint with plasma containing oxygen and fluorine before the step of dry-etching the organic resist film.

According to the second aspect, the remaining layer of the silicon-containing resist film is removed before the dry-etching of the organic resist film. Therefore, the concavo-convex structure formation layer is protected from plasma by the organic resist film. Specifically, when a monolayer resist is formed by the nanoimprint, the concavo-convex structure formation layer is exposed to plasma during the step of removing the remaining layer. However, opportunities of exposure of the concavo-convex structure formation layer to plasma may be reduced by forming a bilayer resist. Therefore, changes in properties caused by exposure of the concavo-convex structure formation layer to plasma may be suppressed.

In a third aspect, in the method for manufacturing a device according to the first or second aspect, the concavo-convex structure formation layer is made of a group-III nitride semiconductor, and is etched with chlorine-containing plasma.

According to the third aspect, since the concavo-convex structure formation layer made of a group-III nitride semiconductor is etched with chlorine-containing plasma, the selectivity to the silicon oxide film may be improved.

In a fourth aspect, in the method for manufacturing a device according to the first or second aspect, the concavo-convex structure formation layer is made of sapphire, and is etched with chlorine-containing plasma.

According to the fourth aspect, since the concavo-convex structure formation layer made of sapphire is etched with chlorine-containing plasma, the selectivity to the silicon oxide film may be improved.

In a fifth aspect, in the method for manufacturing a device according to the first or second aspect, the concavo-convex structure formation layer is formed by a plurality of layers, and is etched with chlorine-containing plasma.

According to the fifth aspect, a fine concavo-convex structure having a high aspect ratio over a plurality of layers may be formed.

BRIEF DESCRIPTION OF THE DRAWINGS

FIG. 2 is a schematic diagram illustrating a method for manufacturing a device according to a first embodiment of the present invention as a method for manufacturing a light emitting device, where

FIG. 5 is a schematic diagram illustrating a method for manufacturing a device according to a second embodiment of the present invention as a method for manufacturing a light emitting device, where

DESCRIPTION OF THE EMBODIMENTS

First Embodiment

A method for manufacturing a device according to one embodiment of the present invention applied to a method for manufacturing a light emitting device will now be described with reference to FIGS. 1 to 4. In the present embodiment, the light emitting device is embodied as an LED.

Figure 1:
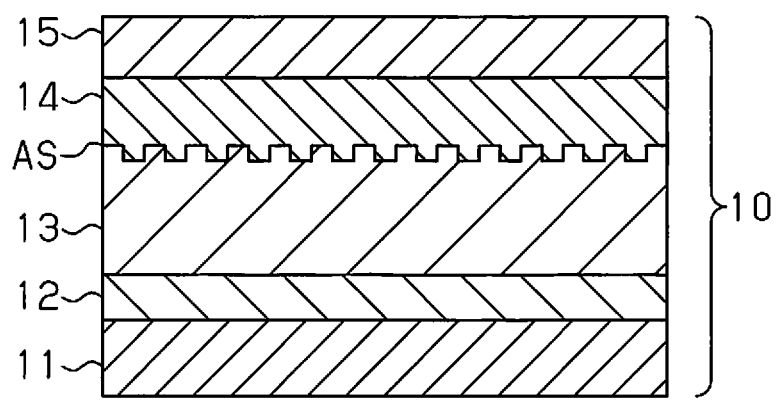
FIG. 1 is a cross sectional view illustrating a laminated body for forming a light emitting device which is a device according to one embodiment of the present invention.

As illustrated in FIG. 1, a laminated body 10 for forming an LED includes a substrate 11, a buffer layer 12, an n-type semiconductor layer 13, an MQW layer 14 having a multi-quantum well structure (MQW), and a p-type semiconductor layer 15.

Any substrate may be used as the substrate 11 so long as the buffer layer 12, n-type semiconductor layer 13, and the like may epitaxially grow thereon. For example, the substrate 11 may be a sapphire substrate. Further, silicon carbide, silicon, and the like may be used as the material of the substrate 11.

The n-type semiconductor layer 13, the MQW layer 14, and the p-type semiconductor layer 15 are made of a group-III nitride semiconductor comprising at least one group-III element such as AlN, GaN, InN, AlGaN, AlInN, GaInN or AlGaInN. In the present embodiment, the n-type semiconductor layer 13 is made of n-type GaN doped with Si or Ge.

A fine concavo-convex structure AS is formed on a surface of the n-type semiconductor layer 13. In the present embodiment, the n-type semiconductor layer 13 corresponds to a concavo-convex structure formation layer. The fine concavo-convex structure AS has a periodic structure having approximately a length obtained by dividing the wavelength which enhances the extraction efficiency of the light emitting device by the refractive index of the material of the n-type semiconductor layer 13. Specifically, when the fine concavo-convex structure AS is optimized as the periodic structure of photonic crystals, the radius R of a concave portion or convex portion and the structural period a are in the relation of "$0.3<R/a<0.4$," and the aspect ratio exceeds 1. The fine concavo-convex structure AS suppresses light propagation in a principal surface direction of the n-type semiconductor layer 13 to emit light in a direction vertical to a principal surface of the n-type semiconductor layer 13, thereby improving the light extraction efficiency.

Figure 2A:
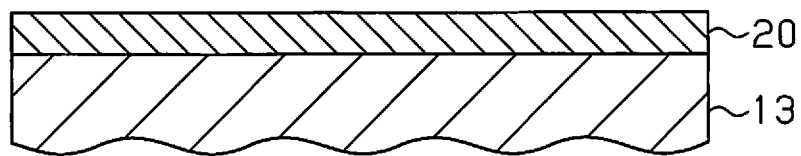
FIG. 2A illustrates the step of forming an organic resist film.

Next, the method for manufacturing a semiconductor light emitting device will now be described in accordance with FIG. 2. As illustrated in FIG. 2A, an organic resist material such as a novolak resin is first applied onto the n-type semiconductor layer 13 by a spin coater or the like to form an organic resist film 20.

Figure 2B:
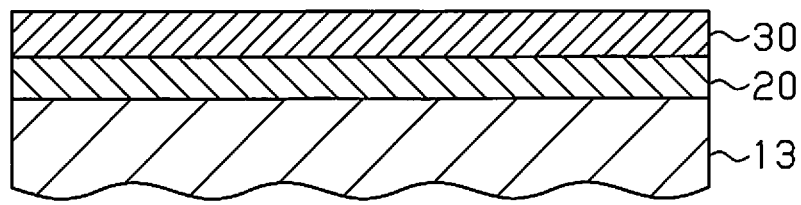
FIG. 2B illustrates the step of forming a silicon-containing resist film.

After the organic resist film 20 is formed, as illustrated in FIG. 2B, a silicon-containing resist material is applied onto the organic resist film 20 by a spin coater or the like to form a silicon-containing resist film 30. The silicon-containing resist film 30 is adjusted to have a thickness which may well ensure the mold release of a master mold in consideration, for example, of the viscosity of the silicon-containing resist material. The silicon-containing resist film 30 has a smaller film thickness than that of the organic resist film 20.

Figure 2C:
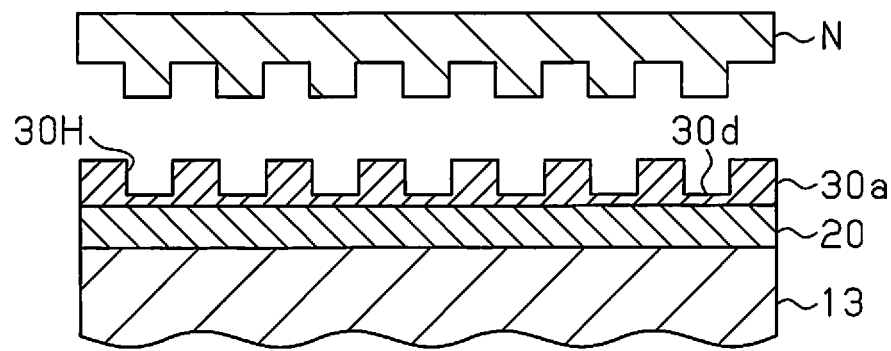
FIG. 2C illustrates the nanoimprint process.

Then, as illustrated in FIG. 2C, the pattern of the fine concavo-convex structure AS is transferred to the silicon-containing resist film 30 by nanoimprint. A master mold N is formed from a substrate of quartz or the like, and includes a surface with a fine structure formed by electron beams or the like. When the master mold N is vertically pressed against the silicon-containing resist film 30, the pattern of the master mold N is transferred to the silicon-containing resist film 30 to form a pattern-transferred film 30a. Here, the depth of the concave portion and the height of the convex portion in the master mold N are set to suppress defective shapes of concave portions 30H and convex portions in the pattern-transferred film 30a. Thus, the verticality of the concave portions 30H in the pattern-transferred film 30a is improved. In this state, a remaining layer 30d is present in the bottom of each concave portion 30H of the pattern-transferred film 30a.

Figure 3A:
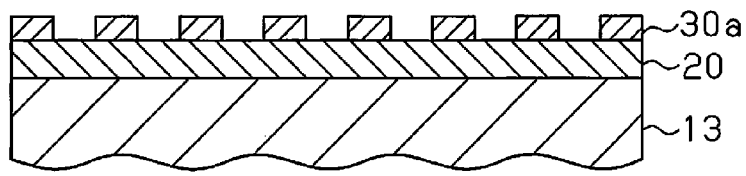
FIG. 3A illustrates the step of removing a remaining layer.

Then, a precursor formed with the pattern-transferred film 30a is carried into a dry etching apparatus. Known apparatuses such as an apparatus having an inductively-coupled plasma source and an apparatus having a capacitively-coupled plasma source may appropriately be used as the dry etching apparatus. The dry etching apparatus includes a gas supply system which supplies an oxygen-containing gas and a fluorine-containing gas. When the precursor is carried into the dry etching apparatus and the plasma source is driven based on predetermined conditions, plasma of the oxygen-containing gas and fluorine-containing gas is generated to remove the remaining layer 30d. That is, as illustrated in FIG. 3A, the surfaces of the convex portions of the pattern-transferred film 30a are etched, and the remaining layer 30d is also etched, whereby the organic resist film 20 is exposed between the convex portions.

Here, when the resist has a monolayer structure, the n-type semiconductor layer 13 arranged below the remaining layer 30d is exposed to plasma containing oxygen and fluorine upon removal of the remaining layer 30d. In contrast, in the present embodiment, the silicon-containing resist film 30 is laminated onto the organic resist film 20. Thus, the n-type semiconductor layer 13 is not exposed to plasma upon removal of the remaining layer 30d. This suppresses changes in properties of the n-type semiconductor layer 13.

Figure 3B:
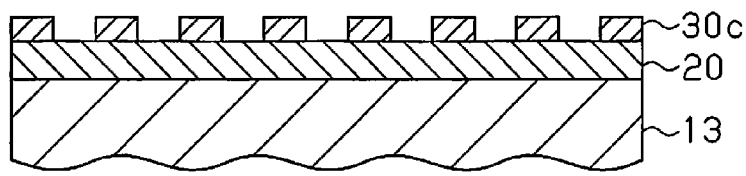
FIG. 3B illustrates the step of oxidizing the silicon-containing resist film.

Next, the precursor from which the remaining layer 30d is removed is carried into a dry etching apparatus including a gas supply system which supplies an oxygen-containing gas. Then, as illustrated in FIG. 3B, the pattern-transferred film 30a from which the remaining layer 30d is removed is exposed to oxygen-containing plasma to form a silicon oxide film 30c.

Figure 3C:
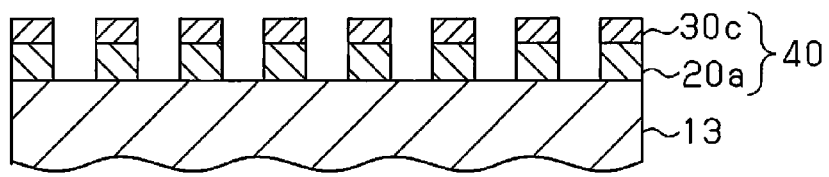
FIG. 3C illustrates the step of patterning the organic resist film.

After the silicon oxide film 30c is formed on the precursor in this manner, the precursor is carried into a dry etching apparatus including a gas supply system which supplies an oxygen gas and a diluent gas such as argon. In the dry etching apparatus, a plasma source is driven to generate oxygen-containing plasma, and the organic resist film 20 is dry-etched via the pattern-transferred film 30a. As a result, as illustrated in FIG. 3C, the organic resist film 20 is patterned to form a pattern formation film 20a in accordance with the silicon oxide film 30c. The silicon oxide film 30c and the pattern formation film 20a form a bilayer resist 40. Because of high verticality of the concave portions of the silicon oxide film 30c, the concave portions formed in the organic resist film 20 also have high verticality.

Figure 3D:
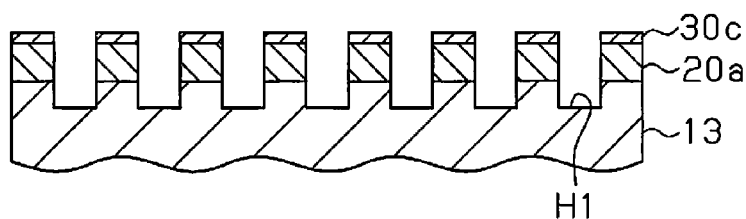
FIG. 3D illustrates the step of dry-etching a GaN layer which is a concavo-convex structure formation layer.

After the bilayer resist 40 is formed on the precursor, the precursor is carried into a dry etching apparatus including a gas supply system which supplies a chlorine-containing gas. A plasma source is driven to generate chlorine-containing plasma and, as illustrated in FIG. 3D, the n-type semiconductor layer 13 is dry-etched to form concave portions H1. The chlorine-containing gas includes $Cl_2$, $BCl_3$, or the like.

The bilayer resist 40 is thick as compared with a resist film formed from silicon oxide alone. The depth of the concave portion formed by dry etching varies depending on the thickness of the resist film in addition to the selectivity to the resist film. Thus, the concave portion having a high aspect ratio may be formed even when the n-type semiconductor layer 13 is formed from the material having a low selectivity to the resist film. Further, because of high verticality of the concave portions of the bilayer resist 40, the verticality of the concave portions formed in the n-type semiconductor layer 13 may be improved.

Further, when a chlorine-containing gas is used as an etching gas, the selectivity of GaN to the mask may be increased. Thus, by using an etching gas that provides a high selectivity while using the bilayer resist 40 having a large film thickness, the aspect ratio of the concave portions H1 may be increased.

Figure 3E:
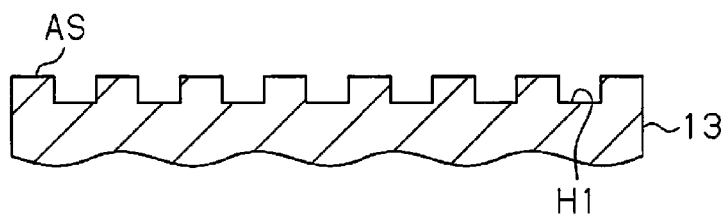
FIG. 3E illustrates a resist removing process.

After the n-type semiconductor layer 13 is patterned, as illustrated in FIG. 3E, the precursor is carried into a dry etching apparatus including a gas supply system which supplies an oxygen-containing gas and a fluorine-containing gas to remove the pattern formation film 20a and the silicon oxide film 30c. As a result, a fine concavo-convex structure AS including concave portions H1 and convex portions formed with substantially the same pitches is formed in the n-type semiconductor layer 13.

After the fine concavo-convex structure AS is formed in the n-type semiconductor layer 13, the MQW layer 14 and the p-type semiconductor layer 15 are epitaxially grown on the n-type semiconductor layer 13, for example, by an MOCVD method, thereby forming a laminated body 10.

Figure 4:
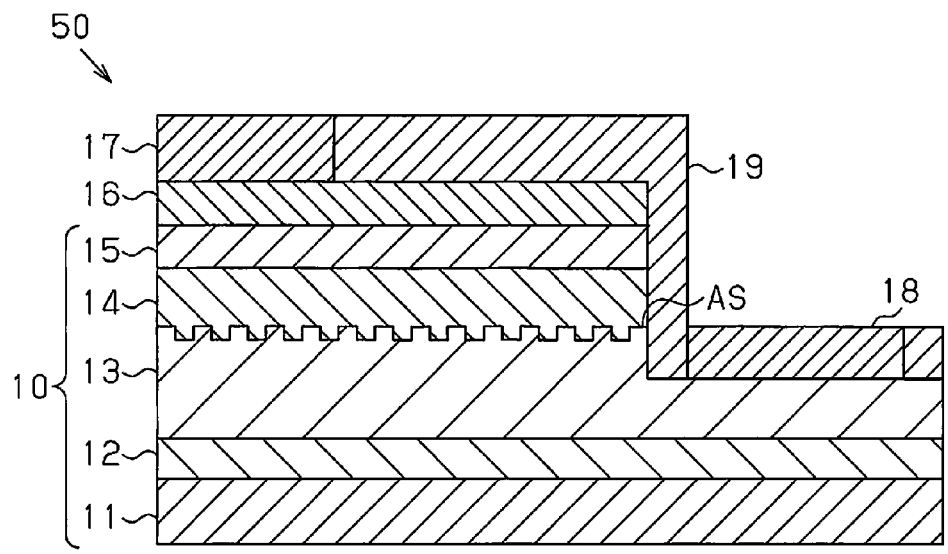
FIG. 4 is a schematic diagram illustrating one example of a light emitting device having the laminated body.

One example of the light emitting device including the laminated body will now be described. As illustrated in FIG. 4, a light emitting device 50 includes the laminated body 10 described above, a transparent electrode layer 16, a p-type pad electrode 17, an n-type pad electrode 18, and an insulating layer 19 laminated on the light emission side. These layers are formed, for example, by the MOCVD method.

The n-type pad electrode 18 is formed on an upper surface of the n-type semiconductor layer 13 exposed by removing the MQW layer 14, the p-type semiconductor layer 15, and the transparent electrode layer 16. The p-type pad electrode 17 is formed on an upper surface of the transparent electrode layer 16. The insulating layer 19 is made of silicon oxide or the like and formed on a part of the transparent electrode layer 16 and a part of the n-type semiconductor layer 13.

The first embodiment has the advantages described below.

(1) In the first embodiment, the fine concavo-convex structure AS is formed in the n-type semiconductor layer 13 by laminating the silicon-containing resist film 30 on the organic resist film 20, patterning the silicon-containing resist film 30 by the nanoimprint process, and forming the bilayer resist 40 by dry-etching the organic resist film 20. When a monolayer resist is formed using the nanoimprint process, the film thickness of the resist is restricted in order to ensure the mold release of the master mold. However, the film thickness of the resist may be increased by forming the bilayer resist 40 using dry etching. Thus, the concave portions H1 having a high aspect ratio may be formed via the bilayer resist 40 in the n-type semiconductor layer 13. Further, a resist film (30c) made of silicon oxide is formed as the upper layer of the bilayer resist 40. This improves the selectivity of the n-type semiconductor layer 13 to the resist film.

(2) In the first embodiment, the remaining layer 30d formed by the nanoimprint process is removed by use of plasma containing oxygen and fluorine before dry-etching the organic resist film 20. When a monolayer resist is laminated on the n-type semiconductor layer 13, the n-type semiconductor layer 13 is exposed to the plasma after removing the remaining layer 30d. However, in the above method, the n-type semiconductor layer 13 is not exposed to the plasma because the n-type semiconductor layer 13 is protected by the organic resist film 20. Therefore, changes in properties due to exposure of the n-type semiconductor layer 13 to plasma are suppressed.

(3) In the first embodiment, the n-type semiconductor layer 13 formed by a group-III nitride semiconductor layer is etched with chlorine-containing plasma. This further improves the selectivity to the bilayer resist 40.

Second Embodiment

Figure 5A:
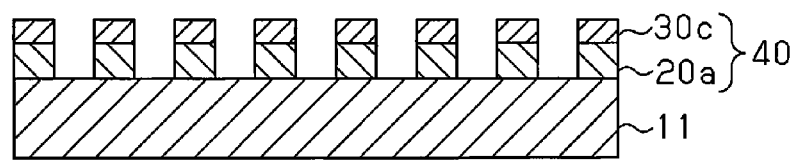
FIG. 5A illustrates the step of forming an organic resist film.

A method for manufacturing a device according to second embodiment of the present invention applied to the method for manufacturing the light emitting device will now be described with reference to FIGS. 5 and 6. In the second embodiment, the element in which the fine concavo-convex structure AS is formed and the manufacturing method differ from those in the first embodiment. The detailed explanations about the same elements are omitted.

In the second embodiment, a fine concavo-convex structure AS is formed in a substrate 11 made of sapphire. Specifically, the substrate 11 corresponds to a concavo-convex structure formation layer in the second embodiment. First, the bilayer resist 40 is formed on a surface of the substrate 11 as illustrated in FIG. 5A. The steps of forming the bilayer resist 40 are similar to those in the first embodiment, including the steps of forming the organic resist film 20 on the substrate 11, forming the silicon-containing resist film 30, performing the nanoimprint process, removing the remaining layer, oxidizing the silicon-containing resist film 30, and dry-etching the organic resist film.

Figure 5B:
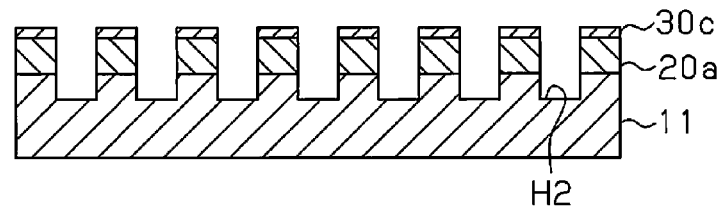
FIG. 5B illustrates the step of forming a silicon-containing resist film.
Figure 6:
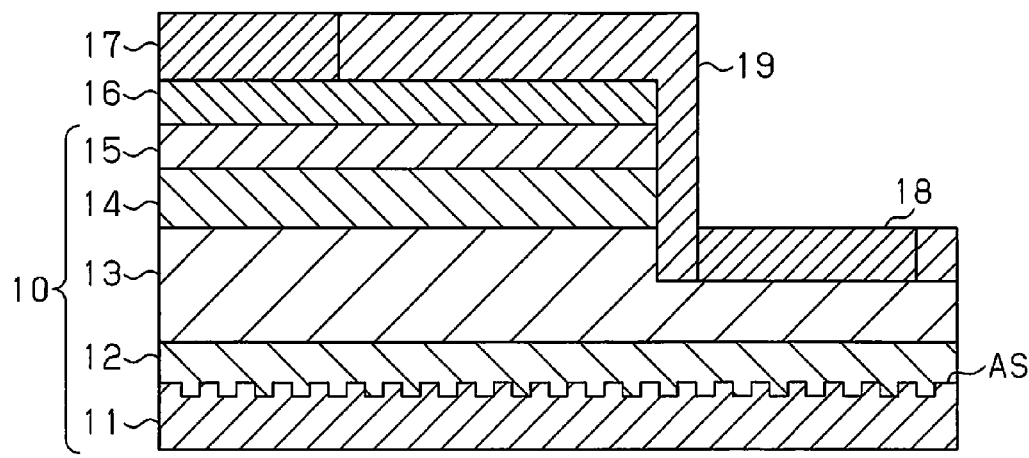
FIG. 6 is a schematic diagram illustrating one example of the light emitting device according to the second embodiment.

After the bilayer resist 40 is formed on the substrate 11, the substrate 11 is carried into a dry etching apparatus including a gas supply system which supplies a chlorine-containing gas and, as illustrated in FIG. 5B, concave portions H2 are formed by dry-etching the substrate 11. Therefore, even when using the sapphire, which tends to have a smaller selectivity to the resist film than that of group-III-V semiconductor compounds, the aspect ratio of the concave portions H2 may be increased by using the bilayer resist 40 having a large film thickness.

Figure 5C:
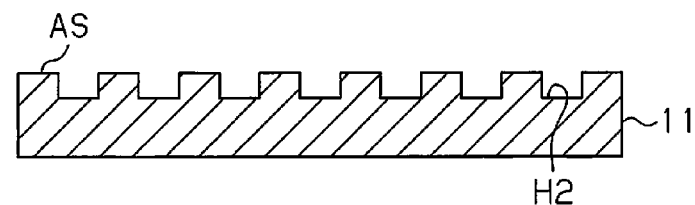
FIG. 5C illustrates the nanoimprint process.

After the substrate 11 is patterned, as illustrated in FIG. 5C, the precursor is carried into an etching apparatus including a gas supply system which supplies an oxygen-containing gas and a fluorine-containing gas to remove the pattern formation film 20a and the silicon oxide film 30c. As a result, the fine concavo-convex structure AS including the concave portions H2 and the convex portions formed with substantially the same pitches is formed in the substrate 11.

After the fine concavo-convex structure AS is formed in the substrate 11, the buffer layer 12, the n-type semiconductor layer 13, the MQW layer 14, and the p-type semiconductor layer 15 are formed on the substrate 11, for example, by the MOCVD method, thereby forming the laminated body 10.

One example of the light emitting device including the laminated body will now be described. While the structure of the light emitting device 50 is similar to that in the first embodiment, the fine concavo-convex structure AS is formed on the substrate 11 made of sapphire, as illustrated in FIG. 6. Thus, light propagation in the principal surface of the substrate 11 is suppressed, so that the light emitting direction is vertical to the principal surface of the substrate 11. This improves the light extraction efficiency.

In addition to the advantages of the first embodiments, the second embodiment has the advantages described below.

(4) In the second embodiment, the substrate 11 made of sapphire is etched with chlorine-containing plasma via the bilayer resist 40. Therefore, the concave portion 112 having a high aspect ratio may be formed even when using the sapphire having a smaller selectivity than that of group-III-V nitride semiconductors. Further, the selectivity to the resist film may be improved by using the chlorine-containing gas.

The embodiment described above may be modified in the following manner.

Figure 7:
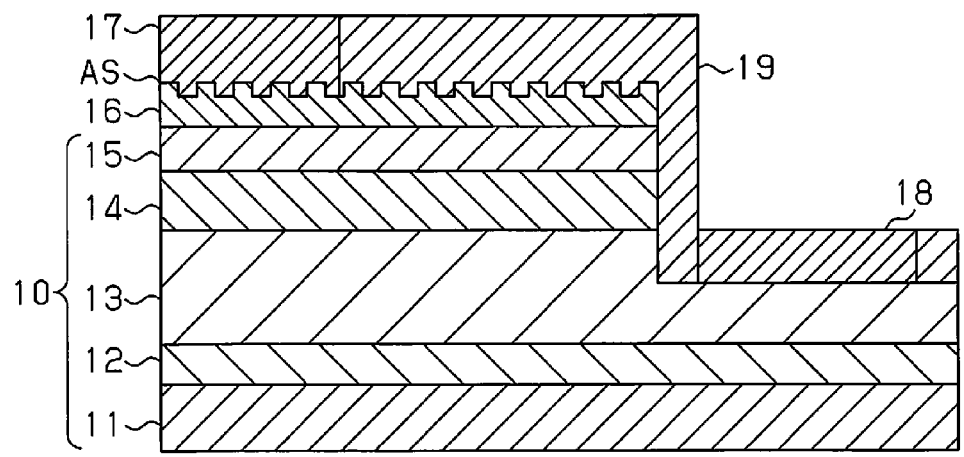
FIG. 7 is a schematic diagram illustrating another example of the device formed by the manufacturing process according to the present invention.

In the above embodiments, the fine concavo-convex structure AS is formed in the n-type semiconductor layer 13 or substrate 11. However, the fine concavo-convex structure AS may also be formed in the transparent electrode layer 16 as illustrated in FIG. 7. In this case, in the same manner as the first embodiment, the bilayer resist 40 is formed in the transparent electrode layer 16, and the transparent electrode layer 16 is dry-etched via the bilayer resist 40. In the embodiment illustrated in FIG. 7, the transparent electrode layer 16 corresponds to a concavo-convex structure formation layer.

In the above embodiments, the fine concavo-convex structure AS is formed in the n-type semiconductor layer 13 or substrate 11. However, the fine concavo-convex structure AS may also be formed in another layer. For example, the fine concavo-convex structure AS may be formed in the MQW layer 14. In this case, the MQW layer 14 is first formed using a film forming apparatus and then taken out of the apparatus, and thereafter the fine concavo-convex structure AS is formed in the MQW layer 14 by the above-described method. Alternatively, the fine concavo-convex structure AS may be formed in the p-type semiconductor layer 15. In this case, the p-type semiconductor layer 15 is first formed using a film forming apparatus and then taken out of the apparatus, and thereafter the fine concavo-convex structure AS is formed in the p-type semiconductor layer 15 by the above-described method. Further, the fine concavo-convex structure AS may be formed not only in a monolayer, but also in a plurality of layers. For example, the fine concavo-convex structure AS may be formed in a depth from the p-type semiconductor layer 15 through the MQW layer 14 to the n-type semiconductor layer 13. In this case, the n-type semiconductor layer 13, MQW layer 14, and p-type semiconductor layer 15 are first formed using a film forming apparatus, and then the concave portions of the fine concavo-convex structure AS are deeply formed, by the above-described method, in the n-type semiconductor layer 13, MQW layer 14, and p-type semiconductor layer 15. In this structure, a concavo-convex structure formation layer is formed by a plurality of layers (13, 14, and 15).

In the above embodiments, although the concave portions H1 and H2 having a high aspect ratio are formed using the manufacturing method of the present invention, the concave portions H1 and H2 having a relatively small aspect ratio are formed using the manufacturing method of the present invention. Specifically, while the thickness of the silicon-containing resist film 30 is reduced to such an extent as to provide a good concavo-convex shape of the transferred pattern, the organic resist film 20 is increased so that the thickness of the bilayer resist 40 is ensured. Even in this case, the verticality of the concave portions of the fine concavo-convex structure AS is improved, and the concavo-convex structure having a high aspect ratio is formed.

In the above embodiments, a light emitting device, which is one example of a device according to the present invention, is embodied as a transmissive light emitting device. However, the device of the present invention may also be embodied as a reflective light emitting device. For example, such a structure may also be employed that a reflection layer made of silver or the like and an insulating layer are provided on the back surface of the substrate 11 which is an opposite side to the surface on which the buffer layer 12 is formed whereby the light emitted from the MQW layer is reflected by the reflection layer to the insulating layer side which is a light extraction surface.

In the above embodiments, the method for manufacturing a device according to the present invention is embodied as a method for manufacturing a light emitting device. However, the method for manufacturing a device according to the present invention is not limited to this, and may be applied to a method for manufacturing a semiconductor device such as a silicon device provided with a silicon through electrode (TSV), and, especially, may be applied to the step of forming the silicon through electrode.

The invention claimed is:

1. A method for manufacturing a device having a concavo-convex structure, the method comprising:

forming an organic resist film on a concavo-convex structure formation layer in which a concavo-convex structure is to be formed;

forming a silicon-containing resist film on the organic resist film;

patterning the silicon-containing resist film by nanoimprint in which a master mold with a pattern of the concavo-convex structure is pressed against the silicon-containing resist film;

oxidizing the silicon-containing resist film with oxygen-containing plasma to form a silicon oxide film;

dry-etching the organic resist film by using the silicon oxide film as an etching mask, thereby forming a bilayer resist of the silicon oxide film utilizing the nanoimprint and the organic resist film utilizing the dry-etching;

dry-etching the concavo-convex structure formation layer by using the bilayer resist silicon oxide film and the organic resist film as an etching masks; and removing the silicon oxide film and the organic resist film.

2. The method for manufacturing a device according to claim 1, further comprising:

removing a remaining layer that remains in a concave portion formed by the nanoimprint with plasma containing oxygen and fluorine before the dry-etching the organic resist film.

3. The method for manufacturing a device according to claim 1, wherein
the concavo-convex structure formation layer is made of a group-III nitride semiconductor, and
the concavo-convex structure formation layer is etched with chlorine-containing plasma.

4. The method for manufacturing a device according to claim 1, wherein
the concavo-convex structure formation layer is made of sapphire, and
the concavo-convex structure formation layer is etched with chlorine-containing plasma.

5. The method for manufacturing a device according to claim 1, wherein
the concavo-convex structure formation layer is formed by a plurality of layers, and
the concavo-convex structure formation layer is etched with chlorine-containing plasma.

* * * * *